United States Patent [19]

Murayama et al.

[11] 3,984,903
[45] Oct. 12, 1976

[54] METHOD OF SPANNING ACROSS A FRAME A HIGH-MOLECULAR-WEIGHT PIEZOELECTRIC ELEMENT

[75] Inventors: Naohiro Murayama; Hiroshi Obara, both of Iwaki, Japan

[73] Assignee: Kureha Kagaku Kogyo Kabushiki Kaisha, Tokyo, Japan

[22] Filed: Dec. 15, 1975

[21] Appl. No.: 640,675

[30] Foreign Application Priority Data
Dec. 13, 1974 Japan.............................. 49-142435

[52] U.S. Cl.................................. 29/25.35; 29/423
[51] Int. Cl.².......................................... B01J 17/00
[58] Field of Search............... 29/25.35, 25.42, 423; 126/247

[56] References Cited
UNITED STATES PATENTS

| | | | |
|---|---|---|---|
| 2,759,241 | 8/1956 | Sturm | 29/25.35 |
| 3,453,711 | 7/1969 | Miller | 29/25.35 |
| 3,518,756 | 7/1970 | Bennett et al. | 29/25.35 X |
| 3,641,640 | 2/1972 | Rayburn | 29/25.42 |

Primary Examiner—Frank T. Yost
Attorney, Agent, or Firm—Sughrue, Rothwell, Mion, Zinn and Macpeak

[57] ABSTRACT

A high molecular weight piezo-electric element is spanned across and adhered to a frame by first affixing the element to a base film which provides support and increases rigidity. Subsequent to adherence, the base film is removed.

16 Claims, 4 Drawing Figures

METHOD OF SPANNING ACROSS A FRAME A HIGH-MOLECULAR-WEIGHT PIEZOELECTRIC ELEMENT

BACKGROUND OF THE INVENTION

The present invention relates to a method of spanning a high-molecular piezo-electric element across a frame body.

It is well known to provide a high-molecular-weight film having a strong piezo-electric property by polarizing under a high d.c. field a high-molecular-weight material, for example, polyvinylidene fluoride, polyvinyl fluoride, etc. Such high-molecular-weight piezo-electric films have numerous desirable characteristic features which could not be obtained with conventional inorganic piezo-electric substances. One of the greatest features of such elements is that they are soft and filmy and can easily be made to have a large surface area. Thus, such films are particularly applicable for use as vibrating films of sound transducers, such as head phones, speakers, etc., as well as various kinds of transducers, key boards, and so on.

When a high-molecular-weight piezo-electric film is used in any of the above-mentioned applications, it is usual to span said film across and adhere said film to a frame body. It is, however, very difficult to span a soft film on a frame body. For example, a high-molecular-weight piezo-electric film having a thickness of approximately 1–20 micrometers is used for vibrating films of head phones, but since such a thin film is extremely soft, it has no self-sustaining property and thereby produces flexure, wrinkles or the like in response to a slight external force. Accordingly, when the thin film is to be spanned on a frame body, wrinkles or local slackenings may easily be produced due to a slight unevenness of tension. However, it is necessary for sound transducers that the vibrating film be spanned uniformly; the above-mentioned wrinkles and slackenings deteriorate the performance of the transducer considerably.

In order to eliminate such a disadvantage, precautions are necessary when the high-molecular-weight piezo-electric film is spanned across a frame body. For example one technique includes, first clamping the periphery of the high-molecular-weight piezo-electric film with a jig that is larger than the frame body, adjusting the jig and film to obtain a uniform spanning without wrinkles or slackenings, and finally pasting the film on the frame body. Apparently such a process is not very efficient.

SUMMARY OF THE INVENTION

It is therefore an object of the present invention to provide a more efficient method of spanning a high-molecular-weight piezo-electric film across a frame without resulting wrinkles.

The inventors, in order to eliminate such difficulties in spanning a high-molecular-weight piezo-electric film on a frame body as stated above, made various sorts of investigations, and as a result found that the process can be greatly facilitated by previously attaching thereto a base film which is thicker than the high-molecular-weight piezo-electric film on one surface thereof.

DETAILED DESCRIPTION OF THE INVENTION

Figure 1:
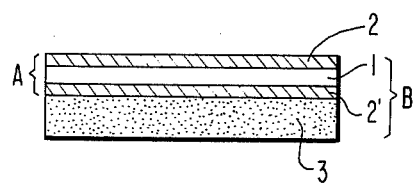
FIGS. 1 through 3 are sectional views showing successive stages of the process for producing high-molecular-weight piezo-electric elements spanned on a frame body according to the present invention.
Figure 2:
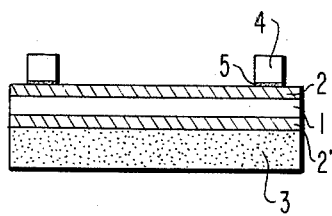
Figure 3:
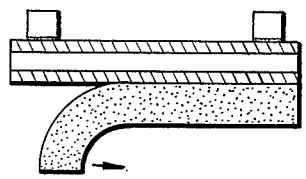

Describing now the present invention referring to the drawing, a base film 3 having a greater thickness than the high-molecular-weight piezo-electric film is affixed and overlapped on one surface of the film 1. The piezo-electric film includes thin electrodes 2, 2' on both surfaces thereof. The laminated body thus obtained is supported by the thick base film and has a self-sustaining ability and an increased resistance against external forces. Therefore no wrinkles or the like will be produced, and the film will remain substantially planer without applying any tension upon fixing with jigs or the like. Then, as shown in FIG. 2, a frame body 4 is placed on the exposed electrode surface 2 of said laminated body and adhered thereto with an adhesive 5 or the like. Thereafter the base film is removed as shown in FIG. 3. No unevenness, such as wrinkles or the like, are found notwithstanding the simplicity of the process. Even when a large number of elements are to be produced, provided that the high-molecular-weight piezoelectric film and the base film are affixed uniformly, dispersion of the products is small due to the fact that the same tension is applied always on the element spanned on the frame body, so that the yield of the products can be greatly improved.

Preferably the base film used in this invention has a less flexibility than the high-molecular-weight piezoelectric film and usually shows a sufficient effect if it is thicker than said high-molecular-weight piezo-electric film. As for the material of the base film, it is not limited particularly, but it is preferable to use high-molecular-weight materials such as polyvinylidene fluoride, polyvinyl fluoride, polyvinyl chloride, polyester, polypropylene or the like, and it is not needed upper limits of the thickness of the base film, but it is preferable having a thickness of 300$\mu$ or less, and more preferable having a thickness between from 20 to 200$\mu$. It is necessary that the piezo-electric film and the base film are closely contacted with each other and that they can be separated easily when necessary. One method for accomplishing the latter includes moistening with a liquid such as water or oil one or both of the interfacing surfaces prior to affixing those surfaces together. Fortunately, the high-molecular-weight films are particularly easy to be electrified statically, so that sufficient adhering property is obtained by their electrostatic attraction when merely overlapping both of the films. Alternatively it has experimentally been determined that sufficient adherence is obtained merely by overlapping both of the films and removing thoroughly the air existing therebetween by pressing with a roller or the like. This process is more effective when it is carried out in a vacuum.

Figure 4:
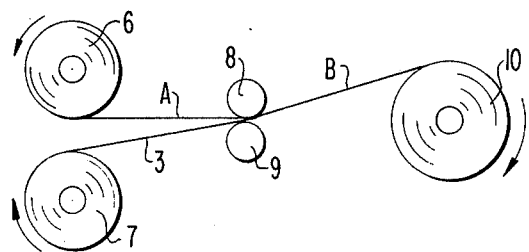
FIG. 4 illustrates one example of a processing method for laminating an elongated element sheet to a base material.

The latter process is extremely suitable to treat an elongated film element as shown in FIG. 4. There, the piezo-electric film element A, wound around a bobbin 6, and the base film 3, wound around a bobbin 7, are unwound from their respective rolls and passed between pressure rollers 8 and 9 to pressure-contact them. The resultant laminate sheet B is taken up on another bobbin 10. In this case, the pressure applied between the pressure rollers 8 and 9 need not be very great. A pressure under which no air gap is provided between the rollers has been found as sufficient for this purpose. Alternatively, the pressure rollers 8 and 9 can be omitted because both films are necessarily pressure-contacted with each other when these films are wound on the bobbin 10 while applying tensions thereto.

Further, such laminating process may be performed prior to the polarization of the piezo-electric element sheet and also prior to the metallization of one surface of the element sheet. For example the element sheet, having one or both surfaces metallized, and the base film may be overlapped. The base film, of course, is in contact with a metallized surface of the element sheet. In the case where only one surface has been previously metallized, the other surface must be metallized after lamination. The overlapped films are then wound on a bobbin, and polarization is performed using the metallized surfaces as the electrodes. In this case, the wrinkles, etc., during polarization can be avoided. Polarizing the wound sheet will not produce a short-circuit between the electrodes because the opposite surface electrodes remain out of contact even in the wound condition. The piezo-electric high-molecular film thus polarized has an intimately contacted base film and, therefore, can be used in the present invention.

As stated above, the characteristic feature of the present invention is that a high-molecular-weight piezo-electric element spanned on a frame body is produced by an extremely simple process as stated above, thus the industrial merit thereof quite significant.

What is claimed is:

1. A method of spanning across a frame, a piezo-electric element of the type consisting of a thin high-molecular-weight piezo-electric film having thin electrodes on both sides thereof, comprising,
   a. affixing a base film thicker than said element to the electrode on one side of said element to form a laminated body comprising said piezo-electric element and said base film,
   b. adhering a frame to the exposed surface of the opposite thin electrode, and
   c. removing said base film.

2. The method of claim 1 wherein said base film is a film having less flexibility than said piezo-electric element.

3. The method of claim 1 wherein said base film is a film of a high-molecular-weight material.

4. The method of claim 1 wherein the step of affixing comprises moistening at least one of the surfaces to be affixed and subsequently bringing said surfaces together.

5. The method of claim 1 wherein the step of affixing comprises statically electrifying said piezo-electric element and said base film so that they will hold together by static electricity.

6. The method of claim 1 wherein the step of affixing comprises placing said piezo-electric element and said base film together and providing pressure thereto to squeeze air from the interface, said last mentioned step being carried out in a substantial vacuum.

7. The method of claim 1 wherein the step of affixing comprises, passing an elongated form of said piezo-electric element and an elongated form of said base film simultaneously through a pair of pressure rollers and taking up the resulting laminated body on a bobbin.

8. A method of forming a thin high-molecular-weight piezo-electric film on a frame comprising,
   a. forming a first thin film electrode on one surface of a high-molecular-weight film to be formed subsequently into a piezo-electric film,
   b. forming a second thin electrode on the opposite, second surface of said film,
   c. affixing a base film thicker than said film to the exposed surface of said first electrode to form a laminated body,
   d. thereafter, polarizing said film into a high-molecular-weight piezo-electric film by applying an electric film between said first and second electrodes,
   e. thereafter adhering a frame to the exposed surface of said second thin electrode, and
   f. removing said base film.

9. The method of claim 8 wherein the step of forming a second thin electrode is carried out prior to the step of affixing a base film.

10. The method of claim 8 wherein the step of forming a second thin electrode is carried out after the step of affixing a base film.

11. The method of claim 9 wherein the step of affixing a base film comprises, passing an elongated form of said film with electrodes thereon and an elongated form of said base film simultaneously through a pair of pressure rollers and taking up said laminated body on a bobbin.

12. The method of claim 11 wherein the step of polarizing is carried out while said laminated body is on said bobbin.

13. The method of claim 8 wherein said base film is a film having less flexibility than said piezo-electric element.

14. The method of claim 8 wherein said base film is a film of a high-molecular-weight material.

15. The method of claim 8 wherein the step of affixing comprises moistening at least one of the surfaces to be affixed and subsequently bringing said surfaces together.

16. The method of claim 8 wherein the step of affixing comprises statically electrifying said piezo-electric element and said base film so that they will hold together by static electricity.

* * * * *